United States Patent
Shin et al.

(10) Patent No.: US 9,055,709 B2
(45) Date of Patent: Jun. 9, 2015

(54) ELECTRONIC COMPONENT FEEDER

(75) Inventors: Jhin-Woo Shin, Seongnam-si (KR);
Tae-Sung Jang, Seongnam-si (KR);
Jong-Eok Ban, Seongnam-si (KR)

(73) Assignee: SAMSUNG TECHWIN CO., LTD., Changwon-Si (KR)

( * ) Notice: Subject to any disclaimer, the term of this patent is extended or adjusted under 35 U.S.C. 154(b) by 506 days.

(21) Appl. No.: 12/689,391

(22) Filed: Jan. 19, 2010

(65) Prior Publication Data
US 2010/0180435 A1   Jul. 22, 2010

(30) Foreign Application Priority Data
Jan. 19, 2009   (KR) .................. 10-2009-0004056

(51) Int. Cl.
*H05K 13/04*   (2006.01)
*B65H 37/00*   (2006.01)

(52) U.S. Cl.
CPC ....... *H05K 13/0417* (2013.01); *Y10T 29/53178* (2015.01); *B65H 37/002* (2013.01)

(58) Field of Classification Search
CPC ............. H05K 13/0417; B65H 37/002; Y10T 29/53178
USPC ................... 29/739, 756, 806, 740–743, 825; 226/122, 139, 162; 221/197, 72, 25; 414/749.1, 411, 416.05
See application file for complete search history.

(56) References Cited

U.S. PATENT DOCUMENTS

| | | | |
|---|---|---|---|
| 5,299,902 A * | 4/1994 | Fujiwara et al. | 414/416.01 |
| 5,319,846 A * | 6/1994 | Takahashi et al. | 29/740 |
| 5,531,859 A * | 7/1996 | Lee et al. | 156/765 |
| 6,634,091 B1 * | 10/2003 | Hwang et al. | 29/720 |
| 6,887,330 B2 | 5/2005 | Onoshiro et al. | |
| 7,052,564 B2 * | 5/2006 | Tandle et al. | 156/64 |
| 7,448,130 B2 * | 11/2008 | Choi et al. | 29/806 |
| 7,584,877 B2 * | 9/2009 | Kim | 226/139 |
| 7,802,957 B2 * | 9/2010 | Yamamura et al. | 414/416.05 |

(Continued)

FOREIGN PATENT DOCUMENTS

| | | |
|---|---|---|
| CN | 1578616 A | 2/2005 |
| JP | 2002-086096 A | 3/2002 |

(Continued)

OTHER PUBLICATIONS

Chinese First Office Action with English Translation issued on Sep. 2, 2011 in corresponding Chinese Patent Application No. 201010004751.2.

(Continued)

*Primary Examiner* — Minh Trinh
(74) *Attorney, Agent, or Firm* — Sughrue Mion, PLLC

(57) ABSTRACT

An electronic component feeder and a chip mount having the electronic component feeder are provided. The electronic component feeder includes a body having a pickup position at which electronic components are picked up and a plurality of component feed paths guiding respective component feed tapes holding the electronic components to the pickup position, and which switches the component feed paths to select a component feed path guiding a component feed tape to the pickup position so that the electronic components held in the component feed tape are picked up at the pickup position, based on a component holding state about the electronic components held in one of the component feed tapes.

10 Claims, 14 Drawing Sheets

(56) References Cited

U.S. PATENT DOCUMENTS

| | | |
|---|---|---|
| 2005/0011926 A1 | 1/2005 | Yanagida |
| 2005/0160593 A1* | 7/2005 | Yamamura et al. ............ 29/832 |

FOREIGN PATENT DOCUMENTS

| | | |
|---|---|---|
| JP | 2002-198690 A | 7/2002 |
| JP | 2002-198691 A | 7/2002 |
| JP | 2003-332789 A | 11/2003 |
| JP | 2004-022867 A | 1/2004 |
| JP | 2005-005289 A | 1/2005 |
| JP | 2005-116599 A | 4/2005 |
| JP | 2005-184031 A | 7/2005 |
| JP | 2007-048891 A | 2/2007 |
| JP | 2007-059654 A | 3/2007 |
| JP | 2007-073632 A | 3/2007 |
| JP | 2007-287932 A | 11/2007 |
| JP | 2007-335595 A | 12/2007 |
| JP | 2008-010687 A | 1/2008 |
| JP | 2008-053382 A | 3/2008 |
| KR | 1020040005653 A | 1/2004 |
| KR | 10-2008-0047097 A | 5/2008 |
| KR | 10-2008-0055179 A | 6/2008 |

OTHER PUBLICATIONS

Communication dated Dec. 24, 2014, issued by the Korean Intellectual Property Office in counterpart Korean Application No. 10-2009-0004056.

* cited by examiner

ELECTRONIC COMPONENT FEEDER

CROSS-REFERENCE TO RELATED APPLICATION

This application claims priority from Korean Patent Application No. 10-2009-0004056, filed Jan. 19, 2009, the contents of which are hereby incorporated herein by reference in their entirety.

BACKGROUND

1. Field

Apparatuses consistent with the present invention relate to an electronic component feeder, and more particularly, to an electronic component feeder and a chip mounter having the same capable of detecting whether electronic components remain in each of component feed tapes, and when it is detected that no electronic components remain, switching a component feed path such that another component feed tape can be continuously fed to a pickup position, thereby not necessitating separate work for splicing leading and trailing component feed tapes.

2. Description of Related Art

In general, chip mounters are used for mounting various electronic components on a printed circuit board (PCB).

Such a chip mounter includes a head assembly having a suction nozzle that sucks up an electronic component to transfer it to a mounting position on a PCB, and a recognition module recognizing a suction state or posture of the electronic component sucked and transferred, and an electronic component feeder stably feeding a variety of electronic components to the head assembly.

Here, the numerous electronic components are held in a component feed tape having a predetermined length at regular intervals. The component feed tape is constituted by a base tape in which the electronic components are held at regular intervals, and a cover tape attached to the base tape in order to cover the electronic components held in the base tape.

This component feed tape is wound onto a reel and manufactured into a product.

FIG. 1 is a perspective view of a related art electronic component feeder.

In a related art, in order to sequentially feed the same electronic components to a pickup position without stopping operation of a chip mounter, there is a demand for splicing work in which a component feed tape 1 wound onto a reel r1 is manually connected by a worker with a component feed tape 2 wound onto a reel r2.

The splicing work is a technique that sequentially feeds the electronic components to the chip mounter by splicing a trailing end of the component feed tape 1, from which the electronic components are exhausted, with a leading end of the new component feed tape 2 using a splicing medium 3 such as an adhesive tape without stopping the operation of the chip mounter.

This splicing technique of splicing these component feed tapes 1 and 2 is disclosed in Korean Patent Application No. 10-2006-0128167.

This splicing technique allows the electronic components to be sequentially fed to the chip mounter without stopping the operation of the chip mounter.

However, in order to splice the component feed tapes 1 and 2, the worker has to predict a point in time when all of the electronic components are exhausted, and then splice the trailing end of the component feed tape 1 that is being used with the leading end of the new component feed tape 2 before all the electronic components are used up at the predicted point in time.

Thus, it is difficult for the worker to accurately predict the point in time when all of the electronic components are exhausted from the component feed tape 1 in advance.

Further, in the case in which the worker fails to correctly predict the point in time when all of the electronic components are exhausted, it may be impossible for the worker to splice the component feed tapes 1 and 2 due to the shortage or excess of a spliceable length. For example, if a point in time at which too many electronic components remain is predicted as the point in time when all the electronic components are exhausted, the remaining component feed tape can be too long to be spliced with the new component feed tape 2.

Meanwhile, the splicing medium 3, such as a splicing tape, is used to splice the two component feed tapes 1 and 2. This splicing medium 3, however, is thin and small, and is thus difficult to handle.

Further, a spliced position between the component feed tapes 1 and 2 may be incorrect due to the splicing medium 3. In this case, a position to which the electronic component is fed varies, so that the electronic component is incorrectly stuck to the suction nozzle when transferred.

SUMMARY

There is provided an electronic component feeder and a chip mounter having the same capable of detecting whether electronic components remain in each component feed tape guided to a pickup position without directly splicing the component feed tapes supplied from different reels, and when it is detected that no electronic components remain, switching a component feed path such that another component feed tape can be continuously fed to the pickup position.

There is also provided an electronic component feeder and a chip mounter having the same capable of eliminating poor splicing between component feed tapes when ends of the component feed tapes are spliced in order to feed electronic components as well as the resulting positional deviation of the components sucked up at a pickup position.

There is also provided an electronic component feeder and a chip mounter having the same capable of continuously guiding a component feed tape on each component feed path to a pickup position depending on whether electronic components remain in the component feed tape.

According to an exemplary embodiment, an electronic component feeder includes: a body having a pickup position at which electronic components are picked up, and a plurality of component feed paths guiding respective component feed tapes holding the electronic components to the pickup position; and a path switching unit which switches the component feed paths to select a component feed path guiding a component feed tape to the pickup position so that the electronic components held in the component feed tape are picked up at the pickup position, based on a component holding state about the electronic components held in one of the component feed tapes.

The path switching unit may include: component sensors which are respectively disposed on the component feed paths and detects whether the electronic components are held in the component feed tapes respectively guided along the component feed paths; a driving roller which is disposed between the component feed paths; idle rollers which are disposed opposite to the driving roller with respect to the component feed paths so as to be in contact with the component feed tapes guided along the component feed paths; a position adjuster which positions the driving roller to come in contact with one of the component feed tapes guided along the component feed paths; a rotation motor which rotates the driving roller; and a controller which receives a signal from one of the component sensors to switch the component feed paths, wherein, if the received signal indicates that the electronic components are not held in the one of the component feed tapes guided along one of the component feed paths, the controller controls the position adjuster to bring the driving roller rotated by the rotation motor in contact with another component feed tape guided along another one of the component feed paths, and guides the other component feed tape to the pickup position so that the electronic components held in the other component feed tape are picked up at the pickup position.

The position adjuster may include a lift shaft rotatably supporting a roller shaft of the driving roller and a cylinder connected with the lift shaft and receiving a signal from the controller to displace the lift shaft to a predetermined position.

Meanwhile, the component feed paths may be further joined with a major component feed path, one end of which leads to the pickup position.

According to another exemplary embodiment, the path switching unit may include: a component sensor which is disposed on the major component feed path and detects whether the electronic components are held in one of the component feed tapes guided along the major component feed path joining the selected component feed path; a main roller which is disposed adjacent to the selected component feed path; a lever which is disposed adjacent to the main roller and comprises a sub-roller guiding the component feed tape from the selected component feed path to the major component feed path; a rotation motor which receives an electrical signal from the controller to rotate the sub-roller; a position adjuster which is connected to the lever and adjusts a position of the lever such that the sub-roller is engaged with the main roller; and a controller which receives a signal from the component sensor, wherein, if the received signal indicates that the electronic components are not held in the one of the component feed tapes guided along the major component feed path, the controller controls the position adjuster to adjust the position of the lever such that another component feed tape is guided to the major component feed path through the selected component feed path.

The lever may rotatably support the sub-roller at a first end thereof, and a second end thereof may serve as a pivoting end hinged to the body. The position adjuster may include a motor installed at the pivoting end of the lever so as to receive the electrical signal from the controller to vary the position of the lever.

Further, the body may include an entrance having the component feed paths on one side thereof.

The lever may be rotatably installed within a vertical length of the entrance subtending the entrance, and the main roller may be disposed above the lever. Further, the selected component feed path may be configured to be in contact with the main roller, and one of the component feed paths may be located below the selected component feed path, and extend parallel to an inclined plane of the entrance which is inclined toward an outside of the entrance in a downward direction.

According to still another exemplary embodiment, the path switching unit may include: a component sensor which is disposed on the major component feed path and detects whether the electronic components are held in one of the component feed tapes guided along the major component feed path; drive units which are disposed on the respective component feed paths and drive the respective component feed tapes to move from the respective component feed paths to the major component feed path; and a controller which receives a signal from the component sensor, wherein, if the received signal indicates that the electronic components are not held in the one of the component feed tapes guided along the major component feed path joining one of the component feed paths, the controller controls operation of the drive units such that another component feed tape on another one of the component feed paths is guided to the major component feed path.

Each of the drive units may include a main roller disposed adjacent to a corresponding component feed path, a rotation motor receiving an electrical signal from the controller to rotate the main roller, and a sub-roller disposed so as to be engaged with each main roller and guiding a corresponding component feed tape to the major component feed path.

BRIEF DESCRIPTION OF THE DRAWINGS

The above and other aspects of the present invention will be described in reference to certain exemplary embodiments thereof with reference to the attached drawings, in which.

DETAILED DESCRIPTION OF EXEMPLARY EMBODIMENTS

An electronic component feeder and a chip mounter having the same according to the present inventive concept will be described below in detail with reference to the accompanying drawings. It should be noted that the terms and words used in the specification and claims pertaining to the present application are best understood when interpreted in the context of the technological concept and scope of the present inventive concept. For example, the term "electronic components" as used herein shall be construed to include semiconductor chips such as silicon chips.

First Exemplary Embodiment

Figure 1:
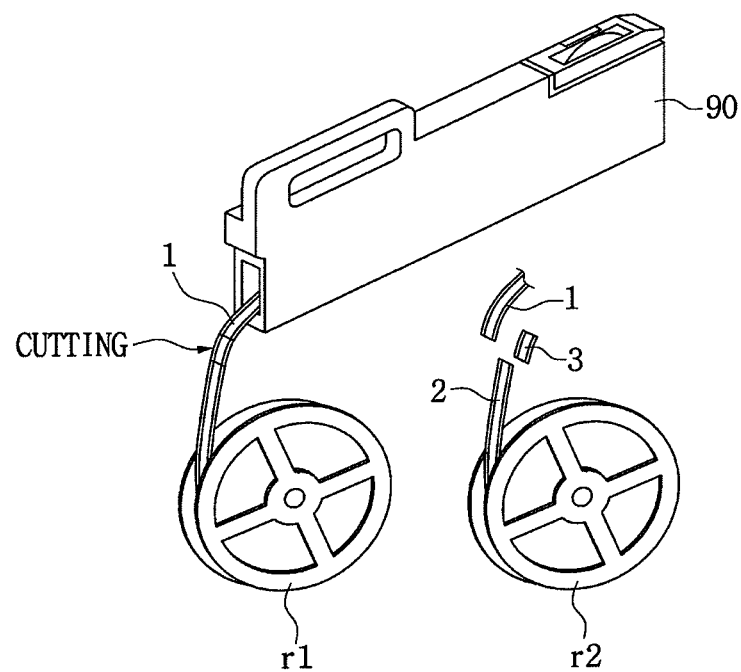
FIG. 1 is a perspective view of a related art electronic component feeder.
Figure 2:
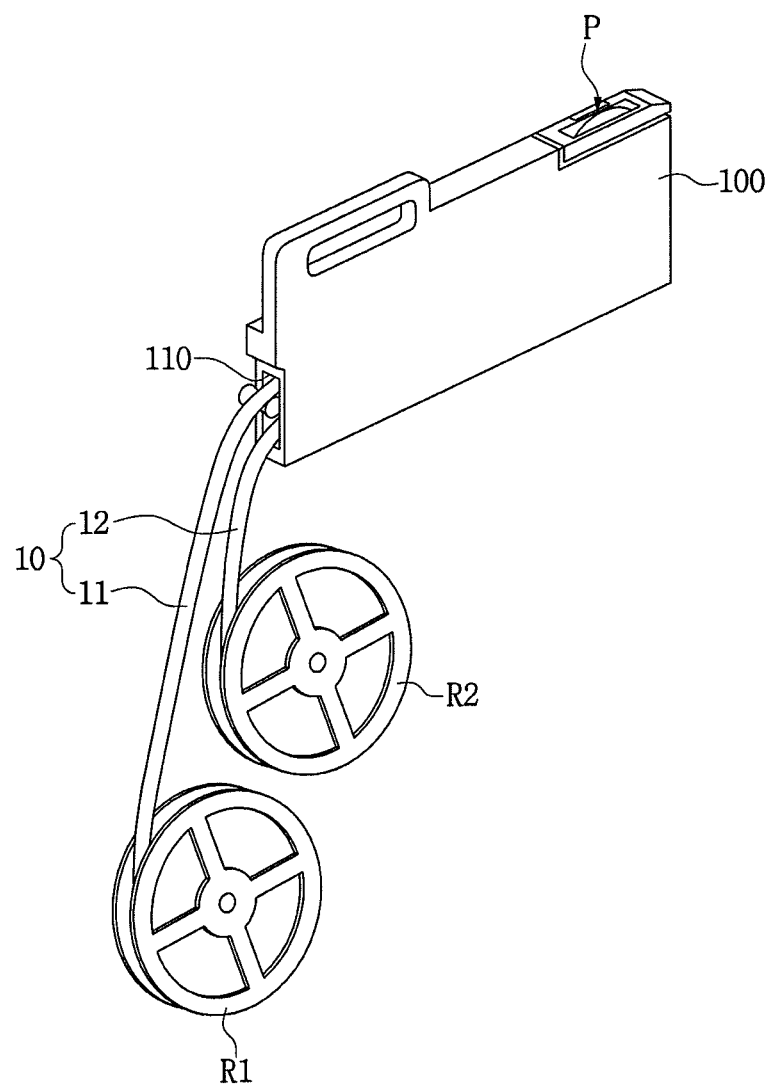
FIG. 2 is a perspective view of an electronic component feeder according to a first exemplary embodiment.
Figure 3:
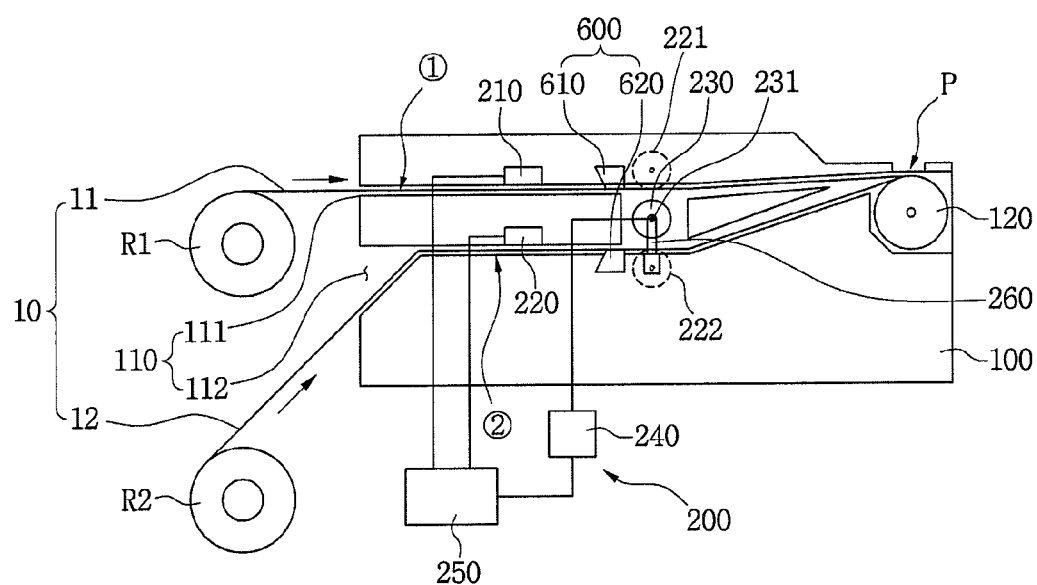
FIG. 3 is a cross-sectional view of the electronic component feeder according to a first exemplary embodiment.
Figure 4:
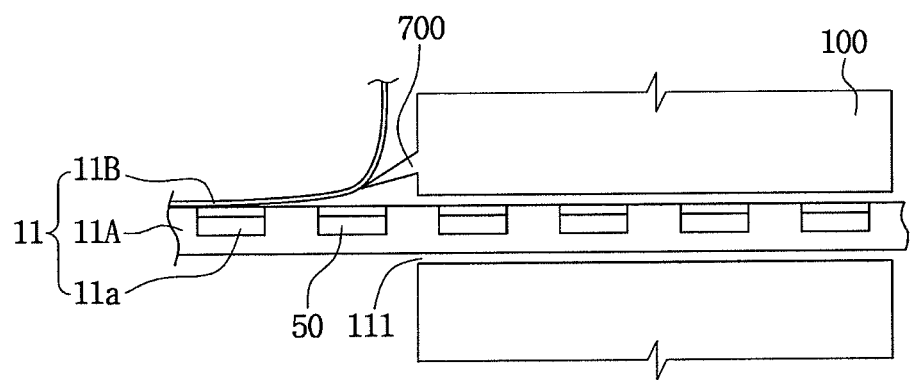
FIG. 4 is a cross-sectional view illustrating the state in which cover tape removal members are installed at respective entrances of the electronic component feeder according to a first exemplary embodiment.
Figure 5:
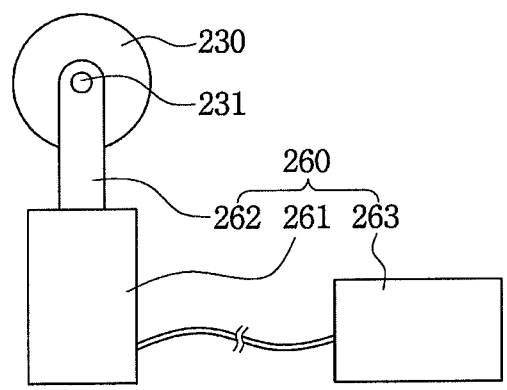
FIG. 5 illustrates the position adjuster of FIG. 3, according to an exemplary embodiment.
Figure 6:
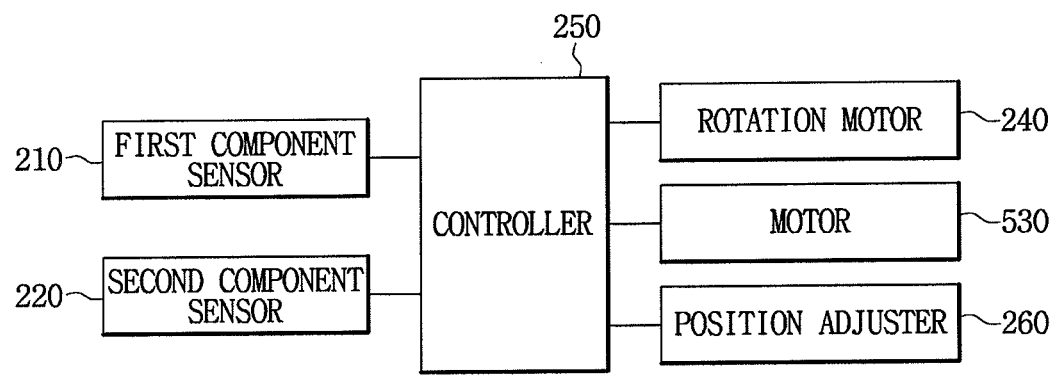
FIG. 6 is a block diagram illustrating operation of the path switching unit of FIG. 3, according to an exemplary embodiment.

FIG. 2 is a perspective view of an electronic component feeder according to a first exemplary embodiment. FIG. 3 is a cross-sectional view of the electronic component feeder according to a first exemplary embodiment. FIG. 4 is a cross-sectional view illustrating the state in which cover tape removal members are installed at respective entrances of the electronic component feeder according to the first exemplary embodiment. FIG. 5 illustrates the position adjuster of FIG. 3. FIG. 6 is a block diagram illustrating operation of the path switching unit of FIG. 3.

Referring to FIGS. 2 through 4, the electronic component feeder according to the first exemplary embodiment picks up each electronic component 50 such as a semiconductor chip (see FIG. 4) at a pickup position P, and includes a body 100 having a plurality of component feed paths ① and ② guiding component feed tapes 10, on which the electronic components 50 are mounted, to the pickup position P, and a path switching unit 200 selectively connecting one of the component feed paths ① and ② to the pickup position P on the basis of a component holding state of each component feed tape 10.

Referring to FIGS. 2 and 3, two reels R1 and R2 are preferably, but not necessarily, disposed on one side of the body 100. The reels R1 and R2 are wound with the respective component feed tapes 10 having a predetermined length. Here, the first reel R1 of the reels R1 and R2 is wound with predetermined turns of the first component feed tape 11 of the component feed tapes 10, and the second reel R2 is wound with predetermined turns of the second component feed tape 12 of the component feed tapes 10. Referring to FIG. 4, the first component feed tape 11 includes a base tape 11A having pockets 11a formed at regular intervals, and a cover tape 11B adhered to one surface of the base tape 11A so as to be able to cover the pockets 11a. Here, the pockets 11a hold the electronic components 50. Further, the second feed tape 12 has the same configuration as the first component feed tape 11.

As illustrated in FIG. 3, the body 100 is provided with entrances 110 on one side thereof through which the component feed tapes 10 fed from the reels R1 and R2 are fed into the body 100. Preferably, but not necessarily, the entrances 110 are formed as a first entrance 111 leading to the first component feed path ① and a second entrance 112 leading to the second component feed path ②.

Here, the first and second component feed paths ① and ② are different from each other, and ends thereof are located at the pickup position P at which a sprocket 120 is installed. The sprocket 120 is provided with teeth on an outer circumference thereof. The teeth of the sprocket 120 are engaged in pitch holes of one of the component feed tapes 10 which are formed along one or opposite lateral edges at regular intervals. Thus, when the sprocket 120 is powered to rotate at regular intervals, one of the component feed tapes 10, the pitch holes of which are engaged with the teeth of the sprocket 120, can regularly move to the pickup position P along the first or second component feed path ① or ②.

Referring again to FIG. 4, cover tape removal members 700 can be installed near the first and second entrances 111 and 112 so as to be able to remove the cover tapes 11B of the component feed tapes 10 fed through the first and second entrances 111 and 112.

Thus, the component feed tapes 10 can be fed through the respective first and second entrances 111 and 112 while the cover tapes 11B are removed by the cover tape removal members 700. As illustrated in FIGS. 3 and 4, the electronic components 50 are exposed to the outside in the pockets 11a of the base tapes 11A. In this state, the electronic components 50 can be guided along the component feed paths ① and ②.

Up to now, the example in which the cover tapes 11B are removed at the first and second entrances 111 and 112 has been described. Referring to FIG. 3, the cover tape removal member 700 illustrated in FIG. 4 may also be disposed at an intersection where the first and second component feed paths ① and ② are merged into a single path, and preferably, but not necessarily, at a predetermined position in front of the pickup position P. In this case, the cover tapes 11B of the component feed tapes 10 may be removed by the cover tape removal members 700 disposed in front of the pickup position P, and discharged to the outside in front of the pickup position P. The base tapes 11A from which the electronic components 50 are picked up may be discharged to the outside of the body 100 in the direction in which the sprocket 120 rotates.

A configuration of the path switching unit 200 will be described with reference to FIGS. 3 through 6.

The path switching unit 200 includes a first component sensor 210 disposed on the first component feed path ①, a second component sensor 220 disposed on the second component feed path ②, a driving roller 230 disposed between the component feed paths ① and ②, a first idle roller 221 disposed opposite to the driving roller 230 so as to be in contact with an upper (or outward) surface of the first component feed tape 11 moving along the first component feed path ①, a second idle roller 222 disposed opposite to the driving roller 230 so as to be in contact with a lower (or outward) surface of the second component feed tape 12 moving along the second component feed path ②, a position adjuster 260 positioning the driving roller 230 to come in contact with one of the component feed tapes 11 and 12 on the component feed paths ① and ②, a rotation motor 240 rotating the driving roller 230, and a controller 250 receiving an electrical signal from one of the component sensors 210 and 220 when it is detected that the electronic components 50 are held in the component feed tape 10 guided along one of the component feed paths ① and ②, controlling the position adjuster 260 to bring the driving roller 230 rotated by the rotation motor 240 in contact with the lower or upper (or inward) surface of the component feed tape 10 guided along one of the component feed paths ① and ②, and guiding the component feed tape 10 to the pickup position P.

In addition, a first one-way clutch 610 is installed on the first component feed path ① between the first component sensor 210 and the sprocket 120, and a second one-way clutch 620 is installed on the second component feed path ② between the second component sensor 220 and the sprocket 120. The one-way clutches 600 are for preventing the component feed tapes 10 from moving in the opposite direction on the component feed paths ① and ②. The one-way clutches 600 can be selectively driven on the basis of an electrical signal of the controller 250. To this end, the one-way clutches 600 are configured to cooperate with actuators (not shown), which are activated by the electrical signal received from the controller 250.

Here, the position adjuster 260 includes a lift shaft 262 rotatably supporting a roller shaft 231 of the driving roller 230, and a cylinder 261 connected with the lift shaft 262 and receiving an electrical signal from the controller 250 to displace the lift shaft 262 to a predetermined position. Here, the cylinder 261 includes a mechanical device that expands or contracts the lift shaft 262 using air pressure supplied from a pneumatic pump 263 installed outside the position adjuster 260. The pneumatic pump 263 is driven by an electrical signal received from the controller 250.

Meanwhile, the body 100 may further include a cutter (not shown), which is disposed adjacent to the component feed paths ① and ②, and cuts off trailing ends of the component feed tapes 10 in which electronic components are not detected a predetermined number of consecutive times by the component sensors 210 and 220. Preferably, but not necessarily, the cutter is disposed adjacent to the sprocket 120.

Here, although not illustrated, the cutter includes a cutter body disposed adjacent to the sprocket 120, a blade installed on the cutter body so as to reciprocate across the component feed paths ① and ②, and a motor installed on the cutter body and receiving an electrical signal from the controller 250 to reciprocate the blade. Here, the motor includes a linear motor. In addition, the cutter body can be connected with an actuator, which displaces the blade so as to allow the blade to reciprocate across the component feed path ① or ②.

Now, the operation of an electronic component feeder according to a first exemplary embodiment will be described.

Referring to FIG. 3, the first component feed tape 11 is fed from the first reel R1 and is placed on the first component feed path ① through the first entrance 111. Further, the second component feed tape 12 is fed from the second reel R2 and is placed on the second component feed path ② through the second entrance 112.

Here, the first and second component feed tapes 11 and 12 can be placed on the respective component feed paths ① and ② either with their cover tapes 11B removed by the cover tape removal members 700 installed on the respective entrances 111 and 112 or with their cover tapes 11B attached to their base tapes 11A.

First, the case in which the first component feed tape 11 moves to the pickup position P along the first component feed path ① will be described.

The controller 250 controls the position adjuster 260 to bring the driving roller 230 in close contact with one surface of the first component feed tape 11 on the first component feed path ①. At this time, the driving roller 230 can be engaged with the first idle roller 221 on the first component feed path ①. Here, the first component feed tape 11 can pass through a gap between the first idle roller 221 and the driving roller 230.

The controller 250 activates the rotation motor 240 to rotate the roller shaft 231 of the driving roller 230. Thus, the driving roller 230 can be rotated in engagement with the first idle roller 221. This rotation of the driving roller 230 allows the first component feed tape 11 to pass through the gap between the first idle roller 221 and the driving roller 230, and to gradually move to the pickup position P.

At this time, the first component sensor 210 disposed on the first component feed path ① can detect whether or not the electronic components 50 are held in the pockets 11a of the first component feed tape 11 guided along the first component feed path ①.

Here, the first component sensor 210 serves to detect the electronic components 50 to generate an electrical signal, and to transmit the electrical signal to the controller 250.

In this manner, when it is determined that the electronic components 50 are present on the first component feed tape 11, the controller 250 controls the rotation motor 240 to be continuously activated.

Thus, the electronic components 50 of the first component feed tape 11 sequentially move to the pickup position P of the body 100, and a pickup nozzle unit, which is on standby above the pickup position P, sequentially sucks up or picks up the electronic components 50 at the pickup position P and transfers the picked-up electronic components 50 to a mounting position at which the electronic components are mounted on a printed circuit board (PCB). Here, although not illustrated, the pickup nozzle unit is displaced in x- and y-axis directions by x- and y-axis gentries installed on the chip mounter, and in a z-axis direction by an actuator connected to one of the x- and y-axis gentries. The pickup nozzle unit can be displaced by the x- and y-axis gentries so as to suck up the electronic components, which are on standby at the pickup position P, using vacuum supplied from the outside and to transfer the electronic components to the mounting position at which the PCB is on standby.

In contrast, when the first component sensor 210 detects a predetermined number of times that the electronic components 50 are absent from the pockets 11a of the first component feed tape 11, the controller 250 immediately stops the operation of the rotation motor 240, and controls the position adjustor 260 to return the driving roller 230 to its original position. Since this operation occurs when all the electronic components are exhausted from the first component feed tape 11, a new component feed tape (i.e. a standby second component feed tape 12) is adapted to be fed to the pickup position P.

To this end, the controller 250 controls the position adjuster 260 to bring the driving roller 230 in close contact with one surface of the second component feed tape 12 on the first component feed path ②. At this time, the driving roller 230 can be engaged with the second idle roller 222 on the second component feed path ②.

Then, the controller 250 activates the rotation motor 240 to rotate the driving roller 230. Thereby, the driving roller 230 can also rotate the second idle roller 222. Thus, the second component feed tape 12 can pass through a gap between the second idle roller 222 and the driving roller 230 and gradually move to the pickup position P along the second component feed path ②.

Thus, the electronic components 50 of the second component feed tape 12 sequentially move to the pickup position P of the body 100, and the pickup nozzle unit, which is on standby above the pickup position P, sequentially sucks up or picks up the electronic components 50 at the pickup position P, and transfers the picked-up electronic components 50 to the mounting position at which the electronic components are mounted on the PCB.

Here, the second component sensor 220 disposed on the second component feed path ② can detect whether or not the electronic components 50 are held in the pockets (not shown) of the second component feed tape 12 guided along the second component feed path ②.

At this time, when the second component sensor 220 detects a predetermined number of times that the electronic components 50 are absent from the pockets of the second component feed tape 12, the controller 250 immediately stops the operation of the rotation motor 240, and controls the position adjustor 260 to return the driving roller 230 to its original position. Since this operation occurs when all the electronic components are exhausted from the second component feed tape 12, the controller 250 controls the cutter to cut off the trailing end of the second component feed tape 12 from which all the electronic components are exhausted, and then a new component feed tape (i.e. a new first component feed tape 11) is adapted to be fed to the pickup position P. Here, the new first component feed tape 11 is a component feed tape that is wound onto a new reel so as to feed the electronic components 50, and thus can be placed on the first component feed path ① through the first entrance 110.

Thus, when all the electronic components are exhausted from the second component feed tape 12, the new component feed tape 11 is guided on the first component feed path ①, and thus the electronic components 50 can be sequentially fed to the pickup position P.

According to the first exemplary embodiment, when all the electronic components 50 are exhausted from one of the component feed tapes 10 wound onto the reels R1 and R2, the other component feed tape can be gradually fed to the pickup position without a separate splicing process.

Second Exemplary Embodiment

Figure 7:
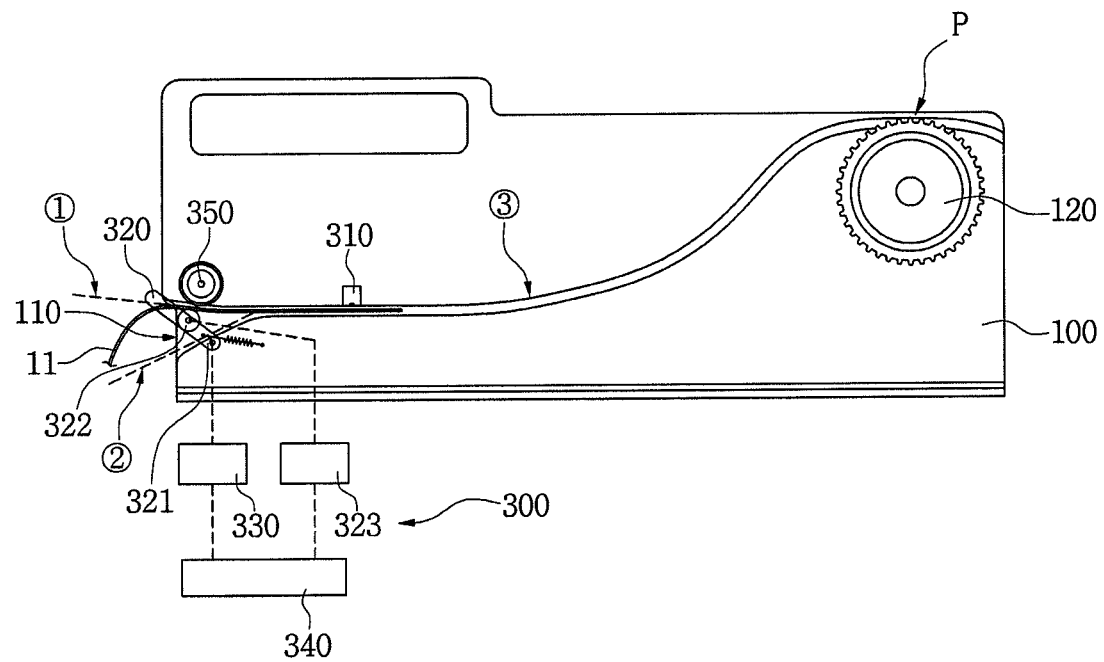
FIG. 7 is a partial cross-sectional view of an electronic component feeder according to a second exemplary embodiment, in which a component feed tape is guided along a first component feed path.
Figure 8:
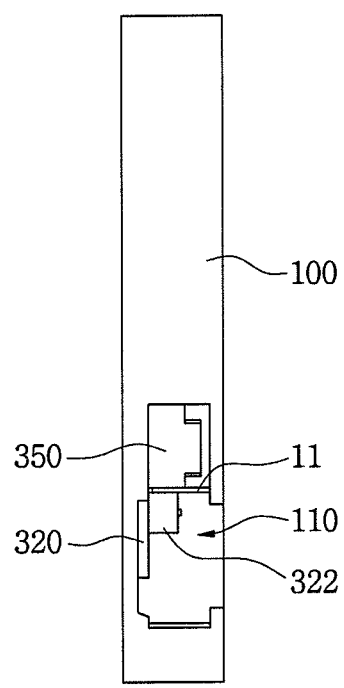
FIG. 8 is a side view of an entrance of the electronic component feeder when is viewed from one side of FIG. 7, according to an exemplary embodiment.
Figure 9:
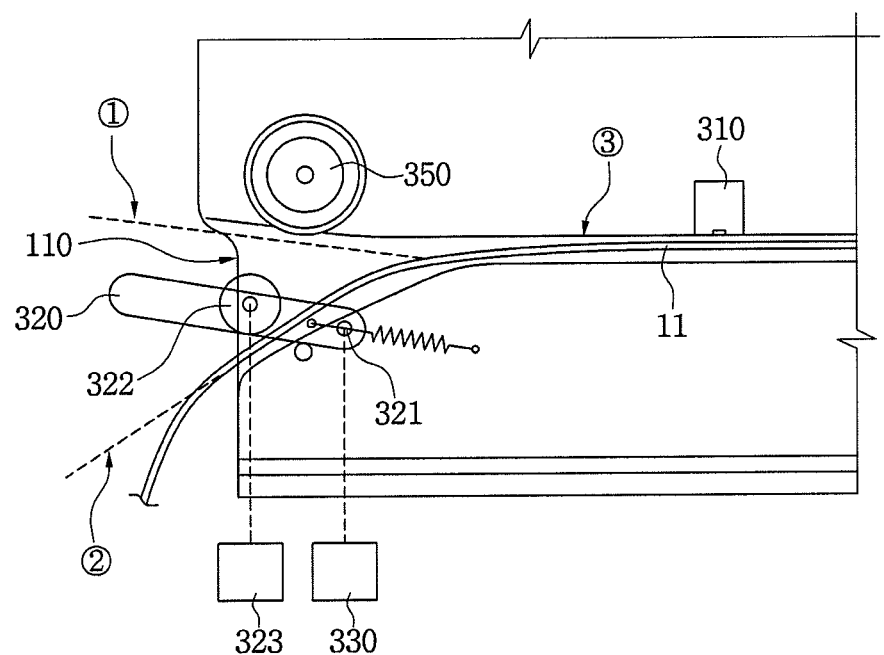
FIG. 9 is a cross-sectional view of the electronic component feeder of FIG. 7 before all electronic components are exhausted from a component feed tape guided along a first component feed path, according to an exemplary embodiment.
Figure 10:
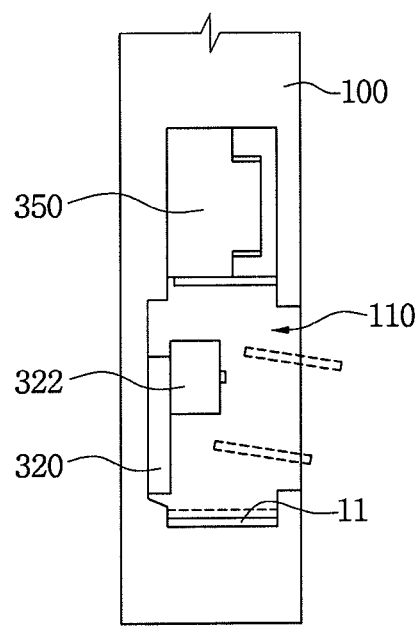
FIG. 10 is a side view of an entrance of the electronic component feeder viewed from one side of FIG. 9, according to an exemplary embodiment.
Figure 11:
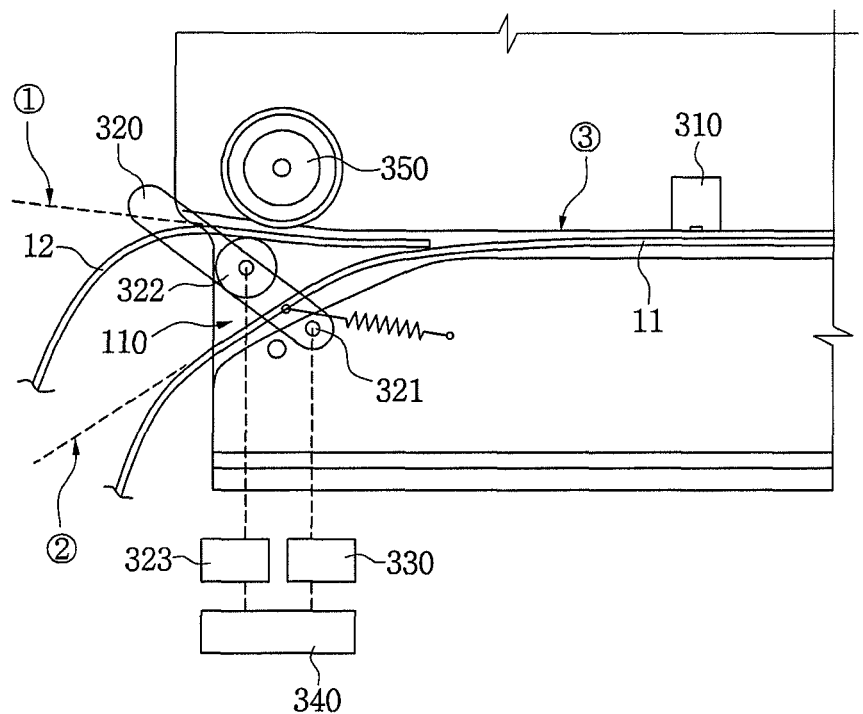
FIG. 11 is a partial cross-sectional view of the electronic component feeder of FIG. 7 in which a component feed tape guided along a second component feed path is on standby, according to an exemplary embodiment.
Figure 12:
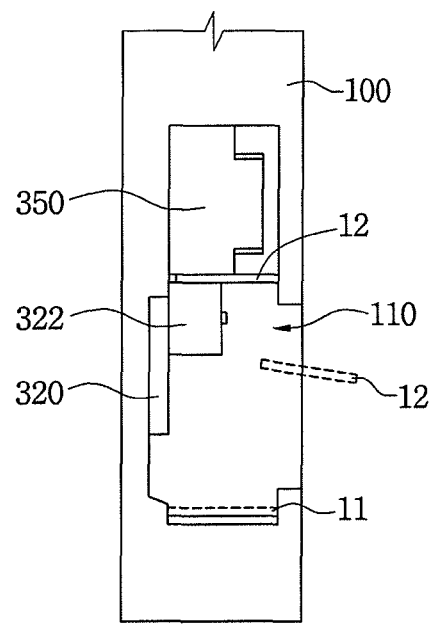
FIG. 12 is a side view of an entrance of the electronic component feeder viewed from one side of FIG. 11, according to an exemplary embodiment.
Figure 13:
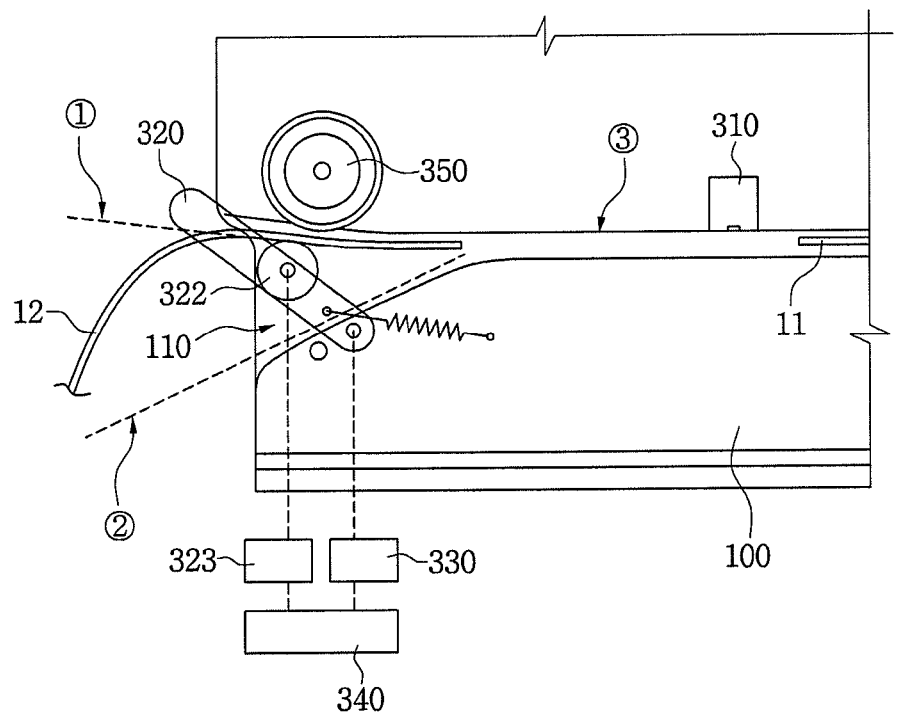
FIG. 13 is a cross-sectional view of the electronic component feeder of FIG. 7 in which all electronic components are exhausted from a component feed tape guided along a first component feed path, according to an exemplary embodiment.
Figure 14:
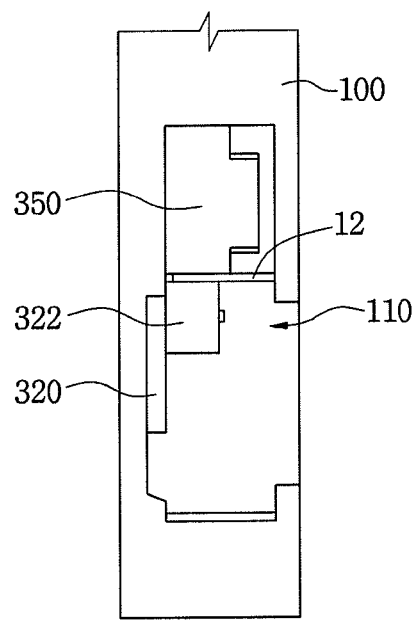
FIG. 14 is a side view of an entrance of the electronic component feeder viewed from one side of FIG. 13, according to an exemplary embodiment.

FIG. 7 is a partial cross-sectional view of an electronic component feeder according to a second exemplary embodiment, in which a component feed tape is guided along a first component feed path. FIG. 8 is a side view of an entrance of the electronic component feeder viewed from one side of FIG. 7. FIG. 9 is a cross-sectional view of the electronic component feeder of FIG. 7 before all electronic components are exhausted from a component feed tape guided along a first component feed path. FIG. 10 is a side view of an entrance of the electronic component feeder viewed from one side of FIG. 9. FIG. 11 is a partial cross-sectional view of the electronic component feeder of FIG. 7 in which a component feed tape guided along a second component feed path is on standby. FIG. 12 is a side view of an entrance of the electronic component feeder viewed from one side of FIG. 11. FIG. 13 is a cross-sectional view of the electronic component feeder of FIG. 7 in which all electronic components are exhausted from a component feed tape guided along a first component feed path. FIG. 14 is a side view of an entrance of the electronic component feeder viewed from one side of FIG. 13.

Referring to FIGS. 7 and 8, the electronic component feeder according to a second exemplary embodiment includes a body 100 and a path switching unit 300.

The body 100 is provided with an entrance 110 on one side thereof. The entrance 110 includes first and second component feed paths ① and ②. The body 100 includes a major component feed path ③, which is joined with the first and second component feed paths ① and ②, and extends to a pickup position of electronic components 50.

The path switching unit 300 includes a component sensor 310 disposed on the major component feed path ③ and detecting whether or not the electronic components 50 are held in each component feed tape 10, a main roller 350 disposed adjacent to the first component feed path ①, a lever 320 disposed adjacent to the main roller 350 and having a sub-roller 322 guiding the component feed tape 10 from one of the first and second component feed paths ① and ② to the major component feed path ③, a rotation motor 323 rotating the sub-roller 322, a position adjuster 330 connected to the lever 320 and adjusting a position of the lever 320 such that the sub-roller 320 is engaged with the main roller 350, and a controller 340 receiving an electrical signal from the component sensor 310 when it is detected that the electronic components 50 are not held in the component feed tape 10 guided along the major component feed path ③ and controlling the position adjuster 330 to adjust the position of the lever 320 such that the component feed tape 10 on one of the component feed paths ① and ② is guided to the major component feed path ③.

Here, the lever 320 rotatably supports the sub-roller 322 at one end thereof, and the other end thereof serves as a pivoting end 321 hinged to the body 100.

Further, the position adjuster 330 includes a motor connected to the pivoting end 321 of the lever 320 so as to receive the electrical signal from the controller 340 to vary the position of the lever 320.

The lever 320 is rotatably installed within a vertical length of the entrance 110 subtending the pivoting end 321 thereof.

Further, the main roller 350 is disposed above the lever 320. The first component feed path ① of the component feed paths ① and ② is configured to be in contact with the main roller 350, and the second component feed path ② of the component feed paths ① and ② is located below the first component feed path ①, and preferably, but not necessarily, extends parallel to an inclined plane of the entrance which is inclined toward the outside of the entrance 110 in a downward direction.

The reels R1 and R2, which are wound with the first and second component feed tapes 11 and 12 guided to the first and second component feed paths ① and ②, have substantially the same configuration as in the first exemplary embodiment, and so a detailed description thereof will be omitted.

Now, the operation of an electronic component feeder according to a second exemplary embodiment will be described.

Referring again to FIG. 7, the first component feed tape 11 moves from the first component feed path ① to the major component feed path ③.

At this time, the first component feed tape 11 is fed from the first reel R1 to the first component feed path ① through an upper side of the entrance 110. Here, the lever 320 rotates toward the upper side of the entrance 110 about the pivoting end 321 thereof, and then the sub-roller 322 is engaged with the main roller 350.

The controller 340 activates the rotation motor 323. The sub-roller 322 can be rotated by the activated rotation motor 323. Thus, the first component feed tape 11 guided to the first component feed path ① passes through a gap between the main roller 350 and the sub-roller 322, and moves along the major component feed path ③.

Here, as described in the first exemplary embodiment, the cover tape removal member as illustrated in FIG. 4 may be disposed at a predetermined position in front of the pickup position or at the entrance 110. In the former case, the first component feed tape 11 can move along the first and major component feed paths ① and ③ with the cover tape 11B attached to the base tape 11A. In the latter case, the first component feed tape 11 can move along the first and major component feed paths ① and ③ with the cover tape 11B removed from the base tape 11A at the entrance 110.

The component sensor 310 detects whether or not the electronic components 50 are held in the first component feed tape 11 moving along the major component feed path ③.

If the component sensor 310 detects that the electronic components 50 are not continuously held in the first component feed tape 11, the controller 340 receives a signal based on the detected result from the component sensor 310 to return the lever 320 to its original position as well as stop the rotation of the sub-roller 322.

In detail, the controller 340 returns the motor of the position adjuster 330 to its initial rotating position, thereby rotating the lever 320 toward a lower side of the entrance 110. The controller 340 stops the rotation of the rotation motor 323, thereby stopping the rotation of the sub-roller 322.

The first component feed tape 11 guided to the first component feed path ① may be placed on the second component feed path ②. More specifically, as illustrated in FIGS. 9 and 10, the first component feed tape 11, from which all the electronic components 50 are exhausted, can be placed so as to be guided along the second component feed path ② parallel to the inclined plane on the lower side of the entrance 110.

As illustrated in FIG. 11, the second component feed tape 12 in which the electronic components 50 are held can be placed so as to be guided to the first component feed path ① on the upper side of the entrance 110.

Here, the second component feed tape 12 can also move along the first and major component feed paths ① and ③ like the first component feed tape as described above.

In this manner, when the second component feed tape 12 is placed on the first component feed path ①, the controller 340 activates the motor 330 to rotate the lever 320 toward the upper side of the entrance 110 about the pivoting end 321 of the lever 320. Thus, the sub-roller 322 installed on the lever 320 can be engaged with the main roller 350. Here, the gap between the sub-roller 322 and the main roller 350 leads to the first and major component feed paths ① and ③.

Thus, as illustrated in FIG. 11, the second component feed tape 12 is placed on the first component feed path ①, thereby standing ready to move to the major component feed path ③.

At this time, the first component feed tape 11, from which all of the electronic components 50 are exhausted, can gradually move along the major component feed path ③ by rotation of a sprocket 120. Here, the engagement of the sprocket 120 and the first component feed tape 11 is the same as in the first exemplary embodiment, and results in the same movement mechanism. Referring to FIGS. 13 and 14, the controller 340 rotates the sub-roller 322 to guide the second component feed tape 12 to the major component feed path ③.

In detail, the controller 340 can activate the rotation motor 323 to rotate the sub-roller 322 installed on the lever 320. Thus, the second component feed tape 12 can pass through the first component feed path ① through the gap between the sub-roller 322 and the main roller 350, and move along the major component feed path ③.

In the case of the second component feed tape 12 newly fed in this way, the component sensor 310 also detects in real-time whether or not the electronic components 50 are held therein, as described above. When all the electronic components 50 are exhausted from the second component feed tape 12, the path switch unit 300 enables a new component feed tape to be fed to the major component feed path ③ through the first component feed path ① by repeating the above-described processes of FIGS. 7, 11 and 13.

Third Exemplary Embodiment

Figure 15:
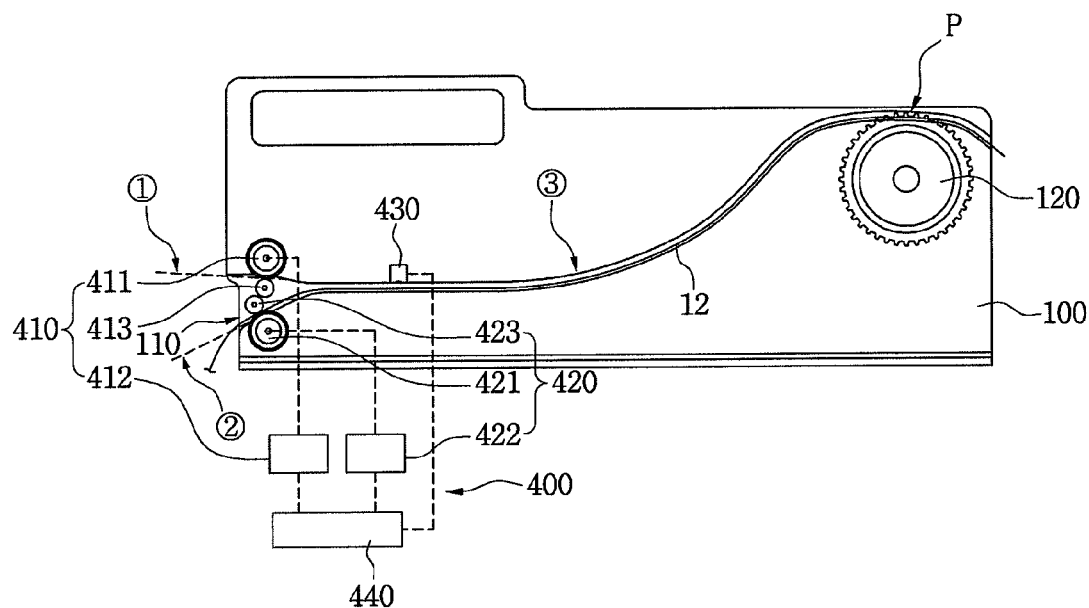
FIG. 15 is a cross-sectional view of an electronic component feeder according to a third exemplary embodiment.
Figure 16:
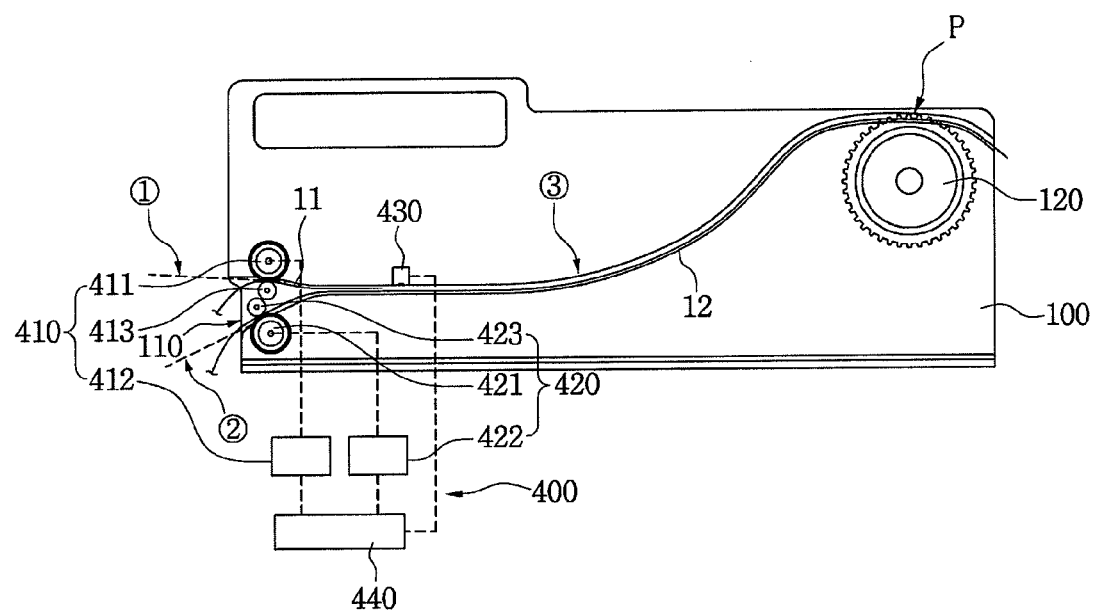
FIG. 16 is a partial cross-sectional view of the electronic component feeder of FIG. 15 in which a component feed tape guided along a second component feed path is on standby, according to an exemplary embodiment.
Figure 17:
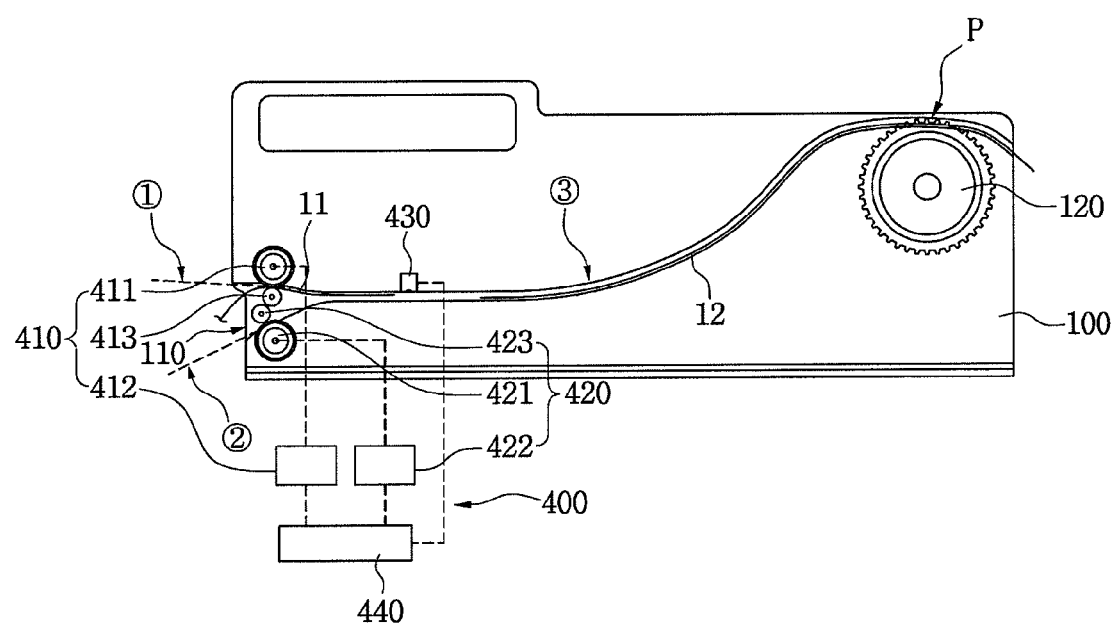
FIG. 17 is a cross-sectional view of the electronic component feeder of FIG. 16 in which all electronic components are exhausted from a component feed tape guided along a first component feed path, according to an exemplary embodiment.

FIG. 15 is a cross-sectional view of an electronic component feeder according to a third exemplary embodiment. FIG. 16 is a partial cross-sectional view of the electronic component feeder of FIG. 15 in which a component feed tape guided along a second component feed path is on standby. FIG. 17 is a cross-sectional view of the electronic component feeder of FIG. 16 in which all electronic components are exhausted from a component feed tape guided along a first component feed path.

Referring to FIG. 15, the electronic component feeder according to a third exemplary embodiment includes a body 100 and a path switching unit 400. The body 100 is provided with an entrance 110 on one side thereof. The entrance 110 includes first and second component feed paths ① and ②. The body 100 includes a major component feed path ③, which is joined with the first and second component feed paths ① and ②, and extends to a pickup position P of electronic components 50.

The path switching unit 400 includes a component sensor 430 disposed on the major component feed path ③ and detecting whether or not the electronic components 50 are held in each component feed tape 10, a first drive unit 410 driving a first component feed tape 11 to move from the first component feed path ① to the major component feed path ③, a second drive unit 420 driving a second component feed tape 12 to move from the second component feed path ② to the major component feed path ③, and a controller 440 receiving an electrical signal from the component sensor 430 when it is detected that the electronic components 50 are not held in the first or second component feed tape 11 or 12 guided along the major component feed path ③, controlling operation of the first and second drive units 410 and 420 such that the component feed tape 10 on one of the component feed paths ① and ② is guided to the major component feed path ③.

Here, the first drive unit 410 includes a first main roller 411 disposed adjacent to the first component feed path ①, a first rotation motor 412 receiving an electrical signal from the controller 440 to rotate the first main roller 411, and a first sub-roller 413 disposed so as to be engaged with the first main roller 411 and guiding the first component feed tape 11 to the major component feed path ③.

The second drive unit 420 includes a second main roller 421 disposed adjacent to the second component feed path ②, a second rotation motor 422 receiving an electrical signal from the controller 440 to rotate the second main roller 421, and a second sub-roller 423 disposed so as to be engaged with the second main roller 421 and guiding the second component feed tape 12 to the major component feed path ③.

A cover tape removal member 700, which can be installed at the entrance 110 or at a predetermined position in front of the pickup position P, has substantially the same configuration as in the first and second exemplary embodiments, and so a detailed description thereof will be omitted.

Now, the operation of an electronic component feeder according to a third exemplary embodiment will be described.

Referring to FIG. 15, the second component feed tape 12 is guided to the major component feed path ③ via the second component feed path ②  and then gradually moves to the pickup position P. Here, the second component feed path ② is a path that runs between the second main roller 421 and the second sub-roller 423. Thus, when the second rotation motor 422 is rotated by a signal of the controller 440, the second component feed tape 12 is guided to the major component feed path ③ through a gap between the second main roller 421 and the second sub-roller 423.

The component sensor 430 installed on the major component feed path ③ detects whether or not the electronic components 50 are held in the second component feed tape 12.

If all of the electronic components 50 are exhausted from the second component feed tape 12, the component sensor 430 detects this situation to transmit a signal based on the detection to the controller 440.

As illustrated in FIG. 17, the controller 440 enables a new first component feed tape 11, which is disposed on the first component feed path ① and holds the electronic components 50, to move from the first component feed path ① to the major component feed path ③.

In detail, the controller 440 rotates the first rotation motor 412, and the first rotation motor 412 can rotate the first main roller 411. Thus, the first component feed tape 11, which enters a gap between the first main roller 411 and the first sub-roller 413, can move to the major component feed path ③.

In this manner, as illustrated in FIG. 17, the first component feed tape 11 can gradually move to the pickup position P along the major component feed path ③ until all of the electronic components 50 are exhausted.

When it is detected by the component sensor 430 that all of the electronic components 50 are exhausted from the first component feed tape 11, the controller 440 activates the second drive unit 420, which is installed on the second component feed path ② to guide a new second component feed tape 12 to the major component feed path ③.

Figure 18:
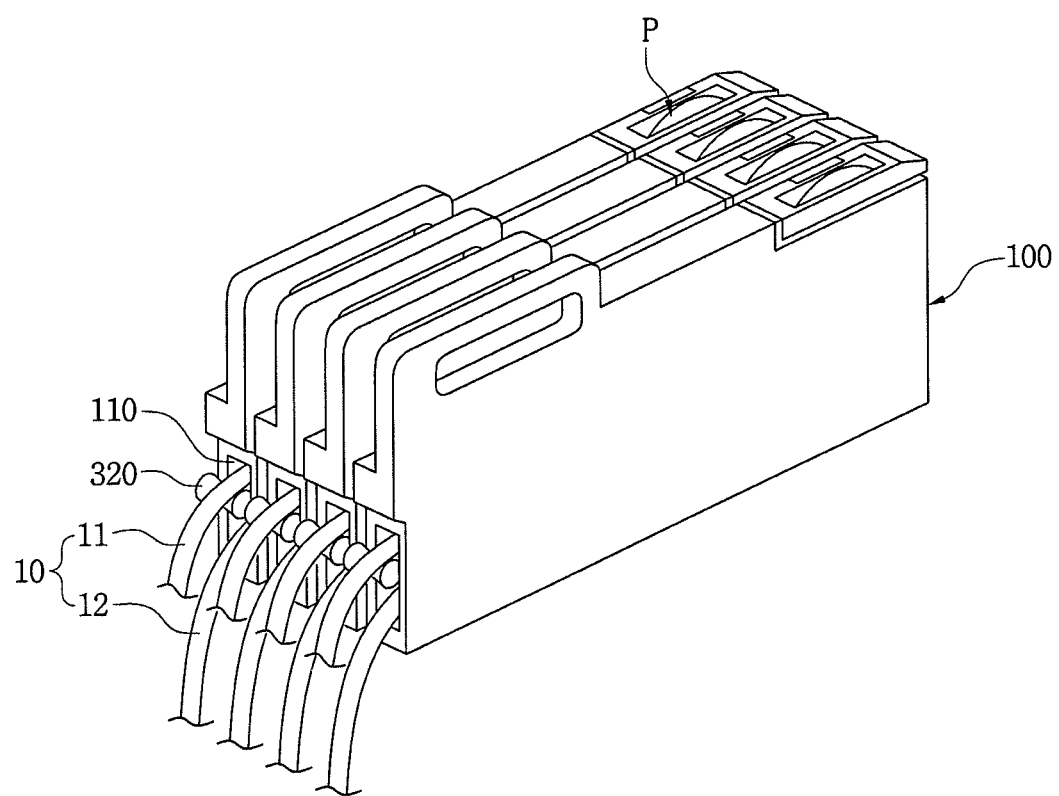
FIG. 18 is a perspective view of an assembly in which a plurality of electronic component feeders according to the present invention are assembled with each other, according to an exemplary embodiment.
Figure 19:
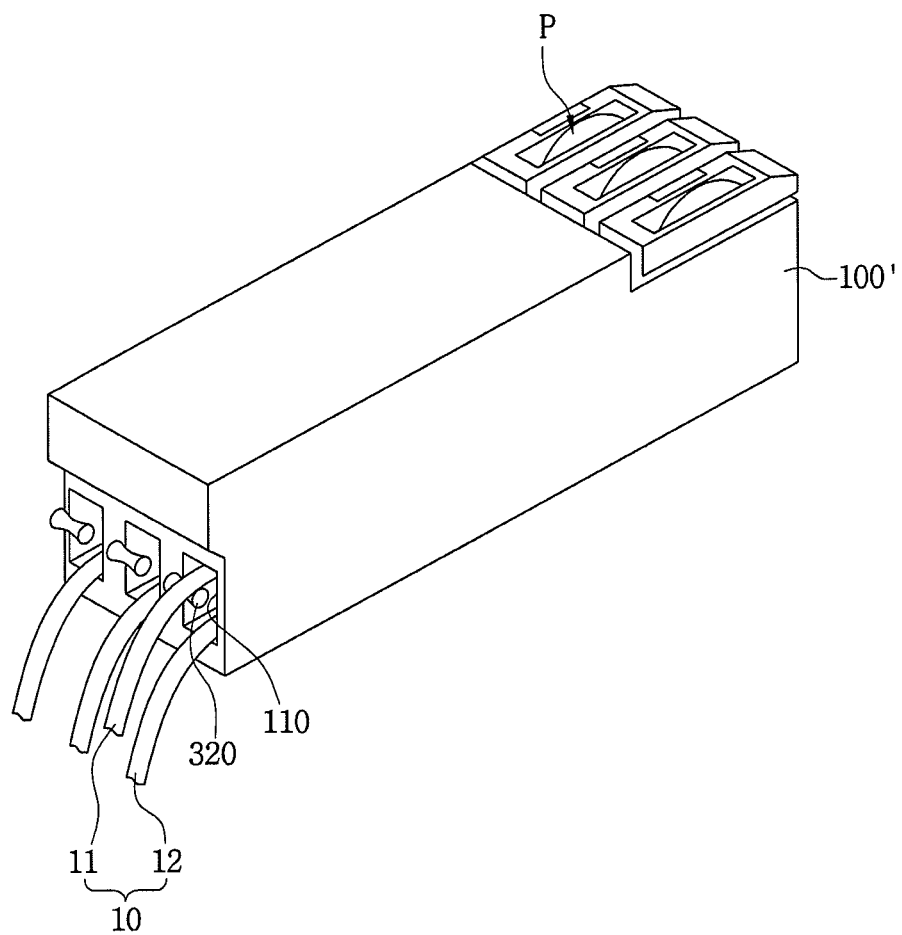
FIG. 19 is a perspective view of an assembly in which a plurality of electronic component feeders are assembled in a single body, according to an exemplary embodiment.

FIG. 18 is a perspective view of an assembly in which a plurality of electronic component feeders are assembled with each other according an exemplary embodiment. FIG. 19 is a perspective view of an assembly in which a plurality of electronic component feeders are assembled in a single body according an exemplary embodiment.

Two or more electronic component feeders, as described in the first and third exemplary embodiments, can be assembled as a single module. In detail, as illustrated in FIG. 18, when four electronic component feeders, each of which includes two reels R1 and R2, are assembled, a total of eight reels can be provided, and thus the electronic components held in the component feed tape of each reel can be sequentially transferred from the pickup position P to the mounting position by the pickup nozzle unit of the chip mounter.

As illustrated in FIG. 19, two or more electronic component feeders, as described in the first and third exemplary embodiments, can be housed in a single body 100'. In this case, the reels for these electronic component feeders can be selectively used in common.

Meanwhile, the cover tape removal members 700, as described in the first exemplary embodiment with reference to FIG. 4, can be equally applied to the second and third exemplary embodiments.

Figure 20:
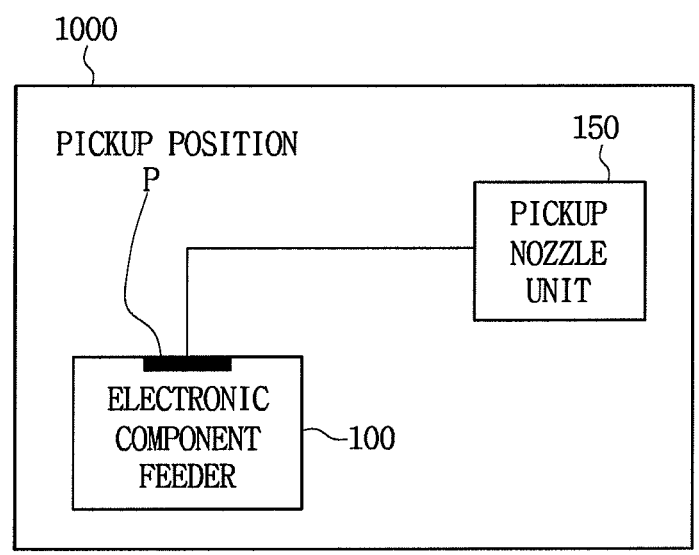
FIG. 20 illustrates a chip mounter including an electronic component feeder and a pickup nozzle unit, according to an exemplary embodiment

FIG. 20 illustrates a block diagram of a chip mounter 1000 including an electronic component feeder 100 and a pickup nozzle unit 150, according to an exemplary embodiment. The pickup nozzle unit is configured to suck up or pick up the electronic components 50 transferred to the pick up position P of the electronic component feeder 100, as described in the previous exemplary embodiments.

According to the exemplary embodiments, an electronic component feeder may detect whether or not electronic components remain in each component feed tape guided to a pickup position without directly splicing the component feed tapes supplied from different reels, and switch a component feed path such that another component feed tape can be continuously fed to the pickup position when it is detected that no electronic component remains.

Further, the electronic component feeder may eliminate poor splicing between component feed tapes when ends of the component feed tapes are spliced in order to feed electronic components as well as the resulting positional deviation of the components sucked up at a pickup position.

In addition, the electronic component feeder may continuously guide a component feed tape on each component feed path to a pickup position depending on whether or not electronic components remain in the component feed tape.

Although the present inventive concept has been described with reference to certain exemplary embodiments thereof, it will be understood by those skilled in the art that a variety of modifications and variations may be made to the present invention without departing from the spirit or scope of the present inventive concept defined in the appended claims, and their equivalents.

What is claimed is:

1. An electronic component feeder for allowing component feed tapes wound onto two or more reels to be moved therethrough in order, which comprises:
   a body configured to have two entrances stacked sequentially in one side and a pickup position in the other side, wherein the entrances and the pickup position are connected to component feed paths which are merged into a single path in front of the pickup position, and two component feed tapes are placed on the component feed paths, respectively; and
   a path switching unit configured to have a driving roller between the component feed paths and idle rollers opposite to the driving roller across the component feed paths in order to select one of the entrances,
   wherein the driving roller is movable to one of the idle rollers through a position adjuster to be rotated together with the one idle roller through a rotation motor, and
   wherein one of the component feed tapes is moved between the one idle roller and the driving roller.

2. The electronic component feeder according to claim 1, further including component sensors and a controller electrically connected to the component sensors and the rotation motor in the path switching unit,
   wherein the component sensors are configured to detect presence of electronic components in the component feed tapes on the component feed paths to generate electrical signals based on the detection and transmit the electrical signals to the controller, and
   wherein the controller is configured to receive an electrical signal from one of the component sensors to control the position adjuster and the rotation motor to bring the driving roller in close contact with the one component feed tape and rotate the driving roller, the one idle roller and the one component feed tape.

3. The electronic component feeder according to claim 2, wherein the driving roller is displaced from an original position thereof to one of the component feed paths when the one component feed tape is placed on the one component feed path and is in engagement with the one idle roller when the one component sensor detects that electronic components are present in the one component feed tape.

4. The electronic component feeder according to claim 3, wherein the one component feed tape is moved from the one entrance via the one component feed path to the pickup position, and wherein a remaining component feed tape is input to a remaining entrance and is on standby on a remaining component feed path until the electronic components of the one component feed tape are exhausted from the one component feed tape.

5. The electronic component feeder according to claim 2, wherein the driving roller is displaced from the one component feed path via the original position thereof to a remaining component feed path when the one component sensor detects that electronic components are absent from the one component feed tape and is in engagement with a remaining idle roller when a remaining component sensor detects that electronic components are present in a remaining component feed tape, and wherein the controller controls a cutter to cut off a trailing end of the one component feed tape from which all of the electronic components are exhausted.

6. The electronic component feeder according to claim 5, wherein the remaining component feed tape is moved from the remaining entrance via the remaining component feed path to the pickup position, and wherein another component feed tape is input to the one entrance and is on standby on the one component feed path until the electronic components of the remaining component feed tape are exhausted from the remaining component feed tape.

7. The electronic component feeder according to claim 6, wherein the driving roller is displaced from the remaining component feed path via the original position to the one component feed path when the remaining component sensor detects that the electronic components of the remaining component feed tape are absent from the remaining component feed tape and is in engagement with the one idle roller when the one component sensor detects that electronic components are present in the another component feed tape, and wherein the controller controls a cutter to cut off a trailing end of the remaining component feed tape from which all of the electronic components are exhausted.

8. The electronic component feeder according to claim 1, wherein the position adjuster comprises a lift shaft configured to rotatably support a roller shaft of the driving roller, and a cylinder configured to receive an electrical signal from the controller and lift the lift shaft to the respective component feed paths.

9. The electronic component feeder according to claim 1, wherein each of the component feed tapes include a base tape configured to hold electronic components in pockets at regular intervals therein and a cover tape configured to cover the electronic components on the base tape, and wherein the cover tape is removed through a cover tape removal member disposed in the vicinity of the component feed paths.

10. The electronic component feeder according to claim 1, further comprising one-way clutches configured to prevent the component feed tapes from moving in a direction from the pickup position to the entrances, wherein the one-way clutches are on the component feed tapes, respectively, and are selectively driven by an electrical signal of the controller.

* * * * *